United States Patent [19]

Holland

[11] 4,382,100

[45] May 3, 1983

[54] APPLICATION OF A LAYER OF CARBONACEOUS MATERIAL TO A SURFACE

[75] Inventor: Leslie A. Holland, Crawley, England

[73] Assignee: National Research Development Corporation, London, England

[21] Appl. No.: 242,530

[22] Filed: Mar. 11, 1981

Related U.S. Application Data

[63] Continuation-in-part of Ser. No. 824,111, Aug. 12, 1977, abandoned.

[30] Foreign Application Priority Data

Aug. 13, 1976 [GB] United Kingdom ............... 33794/76

[51] Int. Cl.³ .............................................. B05D 3/02
[52] U.S. Cl. ....................................... 427/38; 427/39; 427/294
[58] Field of Search ........................... 427/38, 39, 294

[56] References Cited

U.S. PATENT DOCUMENTS 3,961,103 6/1976 Aisenberg ............................ 427/39

Primary Examiner—Bernard D. Pianalto
Attorney, Agent, or Firm—Cushman, Darby & Cushman

[57] ABSTRACT

A layer of a carbonaceous material is applied to a surface by connecting the surface through capacitive means to a radio frequency source, and simultaneously exposing the surface to a plasma generated in a hydrocarbon gas.

10 Claims, 7 Drawing Figures

APPLICATION OF A LAYER OF CARBONACEOUS MATERIAL TO A SURFACE

CROSS REFERENCE TO RELATED APPLICATION

This application is a continuation-in-part of application Ser. No. 824111 filed Aug. 12, 1977 and now abandoned.

BACKGROUND OF THE INVENTION

This invention relates to the application of a carbonaceous lmaterial to a surface.

Several methods are known of applying carbon to a surface, but they may have disadvantages. If carbon is evaporated in vacuo and deposited on an electrical conductor or insulator, the deposition rate may be low and the carbon coating may not adhere firmly. If carbon from a carbon target is sputtered in an argon glow discharge on to a surface, only a small quantity of carbon is released per incident positive ion so that only a slow growth rate can be achieved, perhaps of the order of a monolayer per second. A hydrocarbon gas may be exposed to energetic electrons from a hot electron emitter or a cold cathode or radio frequency glow discharge and a carbonaceous film deposited, but when the polymer-like film which forms contains a high proportion of carbon, adhesion to the substrate may be poor. In yet another method, a metal cathode in a d.c. glow discharge may be exposed to a hydrocarbon gas so that carbon grows on the cathode, but the deposited carbon is of low electrical conductivity, which limits the conduction current and allows an accumulation of positive charge on the coated surface.

It is also known to employ a radio frequency (r.f.) system in a method of applying a carbon-containing material to a surface. In the Japanese Journal of Applied Physics, Volume 12, 1973 No. 5, page 69, Tekeda and Saito use an r.f. discharge excited by an induction coil to form polystyrene film from styrene monomer. In Thin Solid Films, Volume 23, 1974 page S45, Ando and Aozasa use a triode system with one electrode coupled to a r.f. system; a glow discharge is developed in a gas such as styrene and a film of a polymer, such as polystyrene, is deposited on the r.f. coupled electrode. However, a frequency of 100 kHz is used and it is believed that only material containing a high proportion of carbon-hydrogen bonds can be deposited, that is, a conventional high polymeric material.

A specific method of applying a layer of carbon to a substrate surface is described in U.S. Pat. No. 3,961,103, Aisenberg. A carbon-containing plasma is generated in a higher pressure plasma ion chamber. By means of an extraction electrode, positive ions are extracted from the plasma and transferred to a lower pressure vacuum deposition chamber through a constrictor means separating the two chambers. The extraction electrode forms and accelerates a beam of positively charged atomic particles and the beam then impinges on a substrate to be coated. The carbon may be introduced into the plasma chamber in the form of a hydrocarbon gas such as methane. A d.c. bias voltage may be applied to the substrate, and a radio frequency voltage may be superimposed on the bias voltage to alternately bias the substrate surface positive and negative.

In such a method, it is essential to provide two separate chambers at different pressures, to generate a plasma in one chamber, and to extract positive ions into the second chamber in a two-step process with consequent complexity of control apparatus. A further disadvantage is that, since an ion beam is used to supply the coating material, and since such beams rarely exceed 1 centimeter in diameter, only a small area of substrate can be coated. Yet another disadvantage is that during the extraction process a considerable percentage of material is lost and the positive ions in the beam form only a fraction of those available in the plasma.

It is an object of the present invention to provide a method of coating which is less complex, which is capable of operating over an area substantially greater than in the prior art, and which can operate at substantially higher deposition rates.

In this specification, the term 'carbonaceous' means a material which is either pure carbon, or carbon containing a small proportion of hydrogen or other element; the number of carbon-hydrogen bonds is smaller than the number occurring in the $(CH_2)_n$ general structure of a high polymeric or plastics material.

DETAILED DESCRIPTION OF THE INVENTION

According to the invention, a method of applying a carbonaceous material to a surface consisting of placing the surface in an enclosure containing a gas at less than atmospheric pressure, the gas consisting substantially of carbon and hydrogen; and simultaneously generating a plasma in the gas in said enclosure and applying to the surface through capacitive means an electrical potential which changes sign at time intervals of between $5 \times 10^{-9}$ and $10^{-6}$ seconds.

The surfaces may be of a conducting or semiconducting material, when the capacitive means comprises a separate capacitor, or the surfaces may be of an insulating material, when the bodies of material may themselves comprise the capacitive means.

The gas will normally be a hydrocarbon compound with the optional addition of a small proportion of another gas if a "doped" carbonaceous layer is required on the surface.

The plasma may be generated in a two electrode system by said source of radio frequency or may be generated in a three electrode system by separate means, for example an additional radio frequency source or a hot cathode or a cold cathode glow discharge arrangement.

In a two-electrode system, the plasma is generated by connecting the surface through capacitive means to one terminal of a source of electromagnetic radiation at a frequency of between 0.5 and 100 megahertz, and connecting the other terminal of the source to an electrode spaced from the surface.

In a variation, two spaced surfaces to be coated simultaneously are connected through respective capacitive means to a different terminal of a source of electromagnetic radiation at a frequency of between 0.5 and 100 megahertz.

In a conventional sputtering process when carbon is to be deposited, a carbon target is bombarded with positive ions which release particles of the target material for deposition on a separate substrate. In the present process, in complete contrast, a carbonaceous material is deposited directly on the "target". Further, conventional sputtering is normally carried out in an atmosphere of argon or argon and ovygen, and the presence of a hydrocarbon gas is considered deleterious. In the present invention, a hydrocarbon gas is deliberately introduced and the presence of argon or oxygen or water, even at small concentrations, inhibits the growth of carbonaceous material on the surface by reducing the growth rate.

In a conventional sputtering process in which a material is deposited on an insulating substrate, it is usual to apply a radio frequency signal to the target to prevent build-up of a positive charge layer. Since electrons move more quickly than the much heavier positive ions present, the effect is to give the substrate a net negative charge, provided the frequency is between about 0.5 megahertz and 100 megahertz. This effect also occurs when the method of the present invention is used, and the substrate to be coated will be at a negative potential with respect to the plasma; this is an essential condition for the application of a carbonaceous material to the substrate by a method according to the invention.

It is to be understood that, in the method according to the present invention, conventional radio-frequency sputtering apparatus is used. By use of a hydrocarbon gas and the appropriate r.f. frequency, it is possible to apply a layer of carbon to a substrate in a novel coating method.

BRIEF DESCRIPTION OF THE DRAWINGS

The invention will now be described by way of example with reference to the accompanying drawings in which:

In FIG. 1 a glass slide 10 is supported by a metal electrode 11 which is insulated at 12 from the grounded base plate 13 of a vacuum chamber 14. The electrode is connected through a coaxial lead 12A to one terminal of a 13.56 megahertz power supply and matching network 15, the other terminal of which is grounded. This frequency is of a convenient value and is also a permitted radiation frequency. A thin metal shield 8 supported by the base plate 13 is arranged around the surface to be coated.

Figure 1:
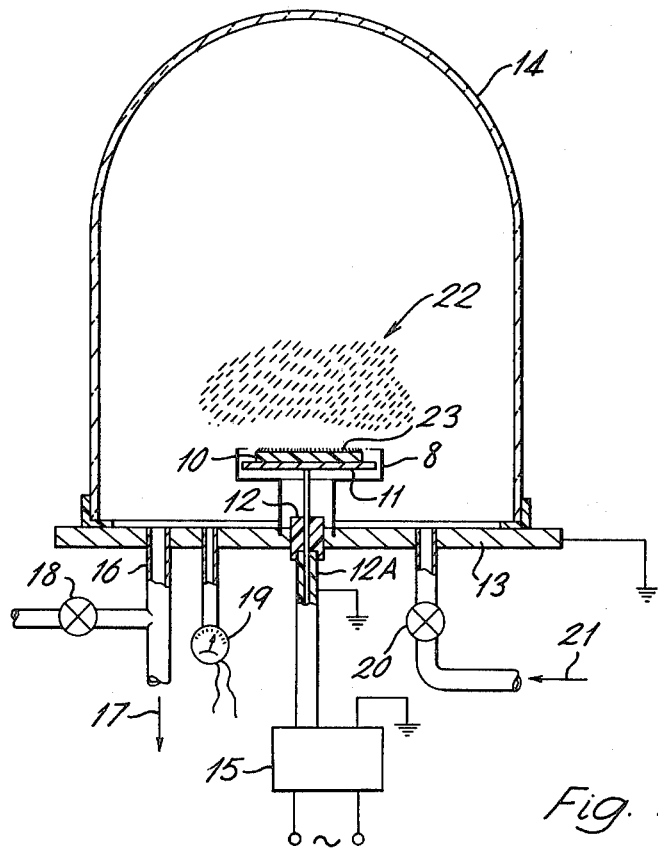
FIG. 1 illustrates apparatus for applying carbon to a surface of an insulating material by a method according to the invention.

The base plate also carries a tube 16 connectable as indicated by the arrow 17 to a vacuum pump or to an air admission valve 18; a vacuum gauge 19; and a tube connection to a needle valve 20 through which a gas supply may be connected as indicated by the arrow 21.

In operation, the chamber 14 is evacuated to $10^{-3}$ torr, and butane gas is admitted through the needle valve 20 to a pressure of between $10^{-2}$ and $10^{-1}$ torr. Connection of the power supply 15 to electrode 11 causes a plasma 22 to form in the chamber between electrode and earthed base plate 13 (which constitutes an r.f. electrode). Under these conditions it has been found that in a few minutes a layer of carbon forms over the whole upper surface of the glass slide 10, as indicated by reference 23. The layer was found to be several micrometers in thickness, hard and tenacious, and resistant to scratching by glass of the same kind as the slide. The shield 8 prevents deposition on other surfaces by spatially limiting the positive ion sheath in the plasma.

Figure 2:
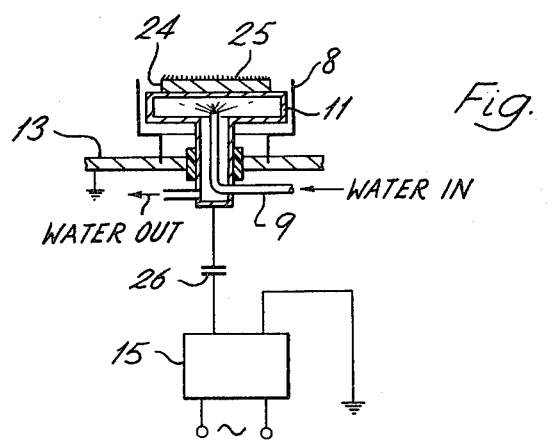
FIG. 2 is a detailed view of the electrical connections used when the carbon is to be applied to an electrically conducting surface.

FIG. 2 indicates the connection to the electrode 11 when a conducting or semiconducting substrate 24 is to be coated. The electrode is then connected to the radio frequency supply 15 through a 600 pF blocking capacitor 26. Under similar conditions to those described above, a carbon layer 25 will be deposited on the substrate. This arrangement also shows a water-circulation system 9 in contact with the electrode 11 to provide temperature control.

Figure 3:
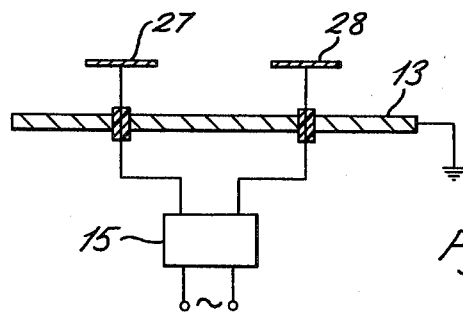
FIG. 3 illustrates an alternative radio frequency supply arrangement.

FIG. 3 illustrates an alternative arrangement to the grounded supply used in the apparatus shown in FIGS. 1 and 2. In a balanced system, two similar spaced electrodes 27, 28, each equivalent to electrode 11, are connected one to each terminal of the supply 15. The electrodes must be capacitively coupled when conducting and semiconducting substrates are to be coated. Two surfaces can be coated simultaneously.

The spacing between the capacitively coupled electrode 11 and the earthed base plate electrode 13 in FIG. 1, or between the two capacitively coupled electrodes 27, 28 in FIG. 3 must be sufficient to allow a plasma to be excited, and must be greater than the depth of the positive sheath in the plasma. The minimum spacing is usually about 2.5 centimeters and a practical spacing is several times greater.

In modified arrangements the second r.f. terminal can be connected directly to the base plate 13 instead of through earth.

Figure 4A:
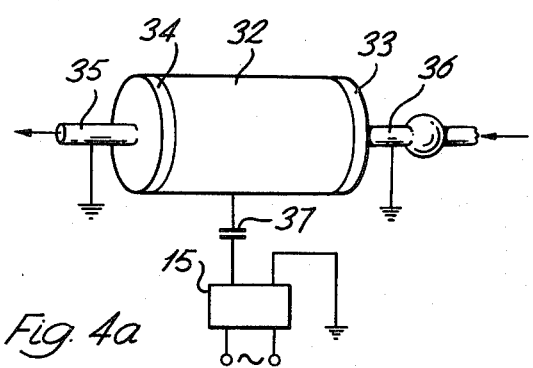
FIGS. 4(a) and 4(b) illustrate apparatus by which carbon may be applied to the inside of a conducting tube and an insulating tube (shown in section) respectively.
Figure 4B:
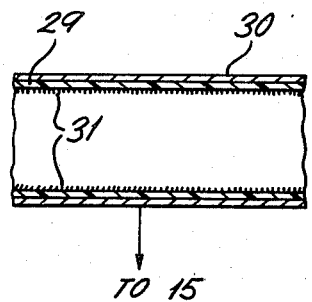

In FIG. 4(a) the inside of a metal cylinder 32 may be coated with a carbonaceous material by sealing the ends of the tube by insulated connectors 33, 34, evacuating the cylinder through a tube 35, supplying hydrocarbon gas through a tube 36, and connecting the cylinder through a blocking capacitor 37 to a radio frequency source. In FIG. 4(b) an insulating cylinder such as a glass tube 29 surrounded by a cylindrical metal electrode 30 can be connected directly to the source without the blocking capacitor. A carbonaceous layer 31 will be deposited in the tube.

Figure 5B:
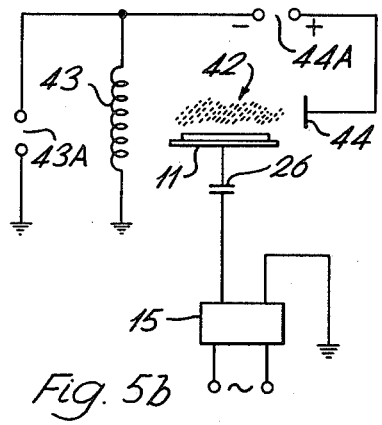
FIGS. 5(a) and 5(b) illustrate schematically alternative ways of generating a plasma from a supply other than the radio frequency source connected to the surface to be coated.
Figure 5A:
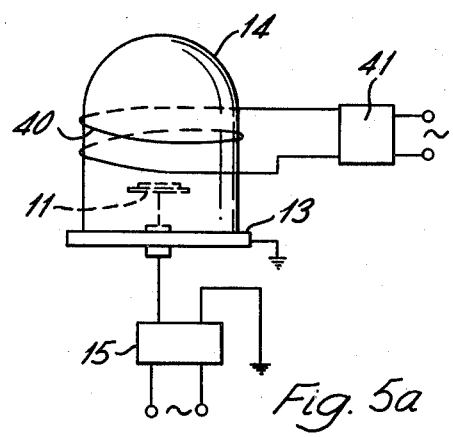

In FIG. 5(a), the vacuum chamber 14 is surrounded by a coil 40 which constitutes a separate source of plasma excitation and which is connected to a second radio frequency source 41 which is used to generate the plasma, while the radio frequency source 15 is connected to the electrode 11 as before. In FIG. 5(b), a plasma 42 is generated between a hot tungsten filament 43 connected to a power supply 43A, and an electrode 44 connected to a power supply 44A, and the electrode 11 connected through blocking capacitor 26 to the source 15 is immersed in the plasma. In both cases, a blocking capacitor is required when a conducting substrate is to be coated, but may not be needed when an insulating substrate is to be coated.

Although temperature control by water-circulation has been shown only in FIG. 2, it may be applied to any of the other arrangements. If temperature is to be increased, in an alternative arrangement an excess of r.f. power may be applied to the surface to be coated, which will raise the temperature.

In all arrangements, the hydrocarbon gas in the plasma is bombarded by electrons and is dissociated and ionised. During part of one half of the r.f. cycle, the surface to be coated is in a region where the applied electric field attracts electrons which, because of their high speed and the short distance of travel, arrive almost instantaneously. Because the surface is connected to a capacitor, the electrons cannot escape through the surface. When the negative charge from the accumulator electrons result in a potential equal and opposite to that of the applied potential, positive ions are attracted to the negatively charged surface and when they impinge on it their charge is neutralised by the electrons, which are replenished from the plasma during part of the next half cycle. The positive ions move much more slowly than the electrons so that the surface has a net negative charge throughout the r.f. cycle. If the positive ions are to have sufficient energy for the surface to be coated, they must be accelerated towards the surface by the negative charge and the reversal of field at the surface must be sufficiently fast to keep the surface at a fairly high net negative charge with respect to the plasma. Suitable frequencies are 0.5 to 100 megahertz.

The surface is bombarded by carbon ions, hydrogen ions, gas molecular ions, ionised fragments and energetic neutral particles. It is believed that the energy deposited on the surface removes superficial matter from the substrate and results in the implantation of carbon. The material deposited on the surface is richer in carbon than the hydrocarbon gas because hydrogen atoms and molecules are more easily removed from the surface. It is believed that the effect is due to the low self-sputtering yield of carbon and the low sputtering yield for hydrogen impinging on carbon.

The proportion of hydrogen in the material with which a surface is coated by a method according to the invention depends on the conditions used. Three different structural types of coating produced under different conditions can be distinguished, although the three types merge from one to the other with no clear division.

(i) "polymeric" type

The carbonaceous layer contains numerous carbon-hydrogen bonds (detectable by infra-red absorption methods) as well as carbon-carbon bonds. The material is formed on the surface when fragmented and reacted hydrocarbon molecules in the plasma combine with hydrocarbon molecules to form larger molecules as they all then impinge on and receive alternate electron and positive ion bombardment on the surface. Such a structure may be useful if, for example, the coated surface is to be carbonised by heating, when the hydrogen will be removed at the elevated temperature.

(ii) amorphous carbon

Such a layer contains no carbon-hydrogen bonds, because any molecule containing a carbon-hydrogen bond and which has condensed on the surface is exposed to the impact of positive ions and electrons in alternate r.f. half-cycles at energies and impact rates per unit area sufficient to break any such bonds, although hydrogen is present in the layer due to sorption and ion burial. The carbon does not have a crystalline structure but has useful properties. For example such a coating on a silicate glass substrate cannot be scratched by a similar glass or by hard metals such as tungsten carbide; the coating is resistant to attack by solvents and active agents which dissolve polymeric hydrocarbons; the coating has a high electrical resistivity, of the order $10^{12}$ ohms per square for films of about 0.2 $\mu$m thick, and good electric breakdown strength. The refractive index is about 2 and the coating is transparent to infra-red radiation at wavelengths above about 1 $\mu$m.

(iii) graphitic carbon

As with type (ii) there are no carbon-hydrogen bonds of the type in a ($CH_2$) chain characteristic of a polymer structure. The material has the usual graphitic structure, with the associated low electrical resistivity, about $10^4$ ohms per square for a coating about 0.1 $\mu$m thick.

The properties of the deposited carbonaceous film are also affected by the temperature of preparation. The surface may either be cooled or heated by provision of a water circulating system in contact with the supporting electrode or may be heated by the supply of high r.f. power. The pressure of butane gas and the negative bias voltage on the surface also affect the type of carbonaceous coating, as illustrated in the Table I below.

TABLE I

| Temperature of Surface °C. | Input power watts | Unit input power watts cm$^2$ torr | Growth rate A° minute | Film thickness A° | Pressure torr | Target bias volts | Type of deposit |
|---|---|---|---|---|---|---|---|
| 15 | 30 | 1 | ~100 | 4,000 | 0.6 | −80 | "polymeric", C—H bonds present |
| 15 | 180 | 24 | ~500 | 1,600 | 0.15 | −600 | amorphous |
| >150 | 420 | 56 | ~800 | 8,000 | 0.15 | −1,300 | graphitic |
| 15 | 450 | 1,800 | ~800 | 2,000 | $5 \times 10^{-3}$ | −1,500 | graphitic |

It can be seen that the r.f. power input per unit target area and per one torr pressure is an important factor in determining the type of deposit. Further, gases other than butane may be used, i.e. hydrocarbon gases having lower or higher molecular weights, and thermally vapourised compounds of up to 400 or 500 atomic mass units; the higher the molecular weight at a given gas pressure and temperature, the greater the required input power, hence the range of values in Table II below, which illustrates the type of deposit produced on a glass target.

TABLE II

| r.f. watts input to plasma per unit target area and per one torr pressure. | type of film deposited on glass |
|---|---|
| $\dfrac{\text{r.f. watts}}{\text{cm}^2 \text{ torr}}$ up to 20 | "polymeric film", C—H bonds present |
| >20 to 200 | amorphous |
| >200 | graphitic |

Since the surface was glass and of low thermal conductivity, the temperature of the surface on which deposition took place was above 200° C. at high input powers, leading to the change in structure. If an amorphous carbon layer is heated after the deposition process, a similar change occurs.

In Table II, the deposits were made at potentials down to −80 volts at $5\times 10^{-3}$ torr and below −100 volts at 0.6 torr.

Materials to which a layer of carbon has been applied by a method according to the invention may be used in circumstances when corrosion resistance or surface hardness are required or may be used as high-value resistors, or as a passivating film on a semi-conductor to prevent corrosion or adsorption of gases etc. The coatings also have optical properties which make them suitable for use as absorption filters of controlled density, optical interference films of high refractive index, to reduce the surface reflectivity of e.g. germanium, and absorptive coatings on opthalmic lenses. Further, the technique may be used for chemical modification of a metal surface by formation of carbides or reduction of oxygen content.

In addition to the method using a gas containing only carbon and hydrogen, other organic gases may be used, either in admixture with a purely hydrocarbon gas or alone, provided the content of reactive elements such as oxygen is not sufficient to remove the carbon as fast as it is deposited. A net deposition is the required condition.

Further, other elements in atomic or molecular gas form may be added to the hydrocarbon gas, provided the sputtering yield of the additional element is insufficient to cause complete removal of the deposited carbon layer. For example, small additions of inert gases may enhance the dissociation of the hydrocarbon gas in the plasma, even though such a gas may reduce the rate of carbon deposition. Other elements, such as group III or group V elements in gaseous compounds, may be added to the plasma and will be implanted or trapped in the carbon film as it is deposited; an example is implanting boron from boron hydride or boron chloride.

The invention has been described with reference to the application of carbon to a flat substrate or the internal surface of a cylinder. It is to be understood that there is no limitation on the shape of a surface which can be coated; the surface may be flat or curved, and the surfaces of a three-dimensional object can be treated. Also, the area of surface which can be coated is limited by the area covered by the plasma, which in turn is limited by the size of the vacuum chamber 14 in which the plasma is generated. Surfaces having areas of hundreds of square centimeters can be coated, in contrast to methods of application using an ion beam of restricted cross section.

There is however a limit to the thickness of amorphous carbon coating which can be applied; it has been found that a film greater than about a few micrometers thick (depending on the substrate material) cracks spontaneously during deposition, and that films thicker than a few thousand Angstrom units (depending on the substrate material) tend to crack a few days after deposition. These effects are believed to be due to hydrogen gas trapped in the film and unable to pass through the amorphous carbon layer.

It may be advantageous to clean a surface before deposition by, for example, sputtering.

I claim:

1. A method of applying a non-crystalline carbonaceous material to a surface consisting of the steps of:
   (1) placing the surface in a single enclosure;
   (2) evacuating the single enclosure;
   (3) supplying to the enclosure a gas consisting essentially of carbon and hydrogen to a pressure sufficient to sustain a plasma, and
   simultaneously:
      generating a plasma in the gas in said single enclosure, while
      applying the surface through capacitive means an electrical potential which changes sign cyclically at time intervals of between $5\times 10^{-9}$ and $10^{-6}$ seconds,
   whereby the surface is maintained at a net negative potential with respect to the plasma so that positive ions are attracted to the surface during a part of each electrical potential cycle solely by the provision on the surface of the net negative potential resulting in a carbonaceous material being deposited on the surface.

2. A method according to claim 1 in which the gas is a hydrocarbon.

3. A method according to claim 2 in which the hydrocarbon is butane.

4. A method according to claim 2 in which the surface is maintained at ambient temperature and the power input applied to unit area of the target per unit reduced pressure is less than 20 watts centimeter$^{-2}$ torr$^{-1}$.

5. A method according to claim 2 in which the surface is maintained at ambient temperature and the power input applied to unit area of the target per unit reduced pressure is between 20 and 200 watts centimeter$^{-2}$ torr$^{-1}$.

6. A method according to claim 2 in which the power input applied to unit area of the target per unit reduced pressure is greater than 200 watts centimeter$^{-2}$ torr$^{-1}$.

7. A method of applying a carbonaceous material to a surface consisting of the steps of:
   (1) placing the surface in an enclosure containing a gas at less than atmospheric pressure, the gas consisting essentially of carbon and hydrogen; and
   (2) connecting the surface through capacitive means to one terminal of a source of electromagnetic radiation at a frequency of between 0.5 and 100 megahertz, and connecting the other terminal of the source to an electrode spaced from the surface,
   whereby simultaneously a plasma is generated in the gas and a net negative bias potential is maintained on the surface with respect to the plasma so that positive ions are attracted to the surface during a part of each electrical potential cycle solely by the provision on the surface of the net negative potential resulting in a carbonaceous material being deposited on the surface.

8. A method of applying a carbonaceous material to two spaced surfaces, said method consisting of the steps of:
   (1) placing the two surfaces in an enclosure containing a gas at less than atmospheric pressure, the gas consisting essentially of carbon and hydrogen; and
   (2) connecting each surface through respective capacitive means to a different terminal of a source of electromagnetic radiation at a frequency of between 0.5 and 100 megahertz,
   whereby simultaneously a plasma is generated in the gas and a net negative bias potential is maintained on each surface with respect to the plasma, so that positive ions are attracted to the surface during a part of each electrical potential cycle solely by the provision on the surface of the net negative potential resulting in a carbonaceous material being deposited on the surface.

9. A method of applying a carbonaceous material to a surface consisting of the steps of:
(1) placing the surface in an enclosure containing a gas at less than atmospheric pressure, the gas consisting essentially of carbon and hydrogen;
(2) connecting the surface through capacitive means to one terminal of a first source of electromagnetic radiation at a frequency of between 0.5 and 100 megahertz;
(3) connecting the other terminal of the source to an electrode spaced from the surface, whereby a net negative bias potential is maintained on the surface; and
(4) simultaneously generating a plasma in the gas by means of a conducting coil surrounding the surface and connected to a second source of electromagnetic radiation at a radio frequency.

10. A method of applying a carbonaceous material to a surface consisting of the steps of:
(1) placing the surface in an enclosure containing a gas at less than atmospheric pressure, the gas consisting essentially of carbon and hydrogen;
(2) connecting the surface through capacitive means to one terminal of a source of electromagnetic radiation at a frequency of between 0.5 and 100 megahertz;
(3) connecting the other terminal of the source to an electrode spaced from the surface, whereby a net negative bias potential is maintained on the surface; and simultaneously generating a plasma in the gas by means of a heated filament and a spaced further electrode and a net negative bias potential is maintained on the surface with respect to the plasma so that positive ions are attracted to the surface during a part of each electrical potential cycle solely by the provision on the surface of the net negative potential resulting in a carbonaceous material being deposited on the surface.

* * * * *